(12) United States Patent
Roper et al.

(10) Patent No.: US 10,056,913 B1
(45) Date of Patent: Aug. 21, 2018

(54) VAPOR CELLS WITH ELECTRICAL CONTROL OF VAPOR PRESSURE, AND METHODS OF USING THE VAPOR CELLS

(71) Applicant: HRL Laboratories, LLC, Malibu, CA (US)

(72) Inventors: Christopher S. Roper, Oak Park, CA (US); Logan D. Sorenson, Agoura Hills, CA (US); Matthew T. Rakher, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 356 days.

(21) Appl. No.: 14/879,510

(22) Filed: Oct. 9, 2015

Related U.S. Application Data

(60) Provisional application No. 62/062,200, filed on Oct. 10, 2014.

(51) Int. Cl.
*H03L 7/26* (2006.01)
(52) U.S. Cl.
CPC ...................................... *H03L 7/26* (2013.01)
(58) Field of Classification Search
None
See application file for complete search history.

(56) References Cited

U.S. PATENT DOCUMENTS

| | | | |
|---|---|---|---|
| 5,192,921 A | 3/1993 | Chantry et al. | |
| 6,010,614 A * | 1/2000 | Keskar | B01D 53/22 205/763 |
| 8,258,884 B2 | 9/2012 | Borwick, III et al. | |

(Continued)

FOREIGN PATENT DOCUMENTS

| | | |
|---|---|---|
| WO | 1997012298 A1 | 4/1997 |
| WO | 2000043842 A2 | 2/2001 |

OTHER PUBLICATIONS

Svenja Knappe, MEMS Atomic Clocks, National Institute of Standards and Technology (NIST), Boulder, CO, USA Published by Elsevier B.V., Comprehensive Microsystems, vol. 3, pp. 571-612, 2007.

(Continued)

*Primary Examiner* — Arun S Phasge
(74) *Attorney, Agent, or Firm* — O'Connor & Company

(57) ABSTRACT

A vapor-cell system and method is provided, comprising an enclosed vapor-cell region containing a vapor-cell gas phase comprising a vapor-cell alkali or alkaline earth metal, wherein the vapor-cell region is configured to allow at least one vapor-cell optical path through the vapor-cell gas phase; an enclosed reservoir region containing a reservoir alkali or alkaline earth metal, wherein the reservoir region is in vapor isolation from the vapor-cell region; a solid electrolyte disposed in ionic communication between the vapor-cell region and the reservoir region; a first electrode disposed between the solid electrolyte and the vapor-cell region; and a second electrode disposed between the solid electrolyte and the reservoir region, wherein the second electrode is electrically isolated from the first electrode. This vapor-cell system enables independent control of the alkali or alkaline earth vapor pressure in the vapor cell. The principles disclosed herein can improve long-term frequency stability in systems having vapor cells.

26 Claims, 9 Drawing Sheets

(56) References Cited

U.S. PATENT DOCUMENTS 8,624,682 B2    1/2014  Ridley et al.
2011/0247942 A1  10/2011  Bernstein et al.

OTHER PUBLICATIONS

Jonathan J. Bernstein et al., "All Solid-State Ion-Conducting Cesium Source for Atomic Clocks," Solid State Ionics, vol. 198, No. 1, Sep. 2011.

* cited by examiner

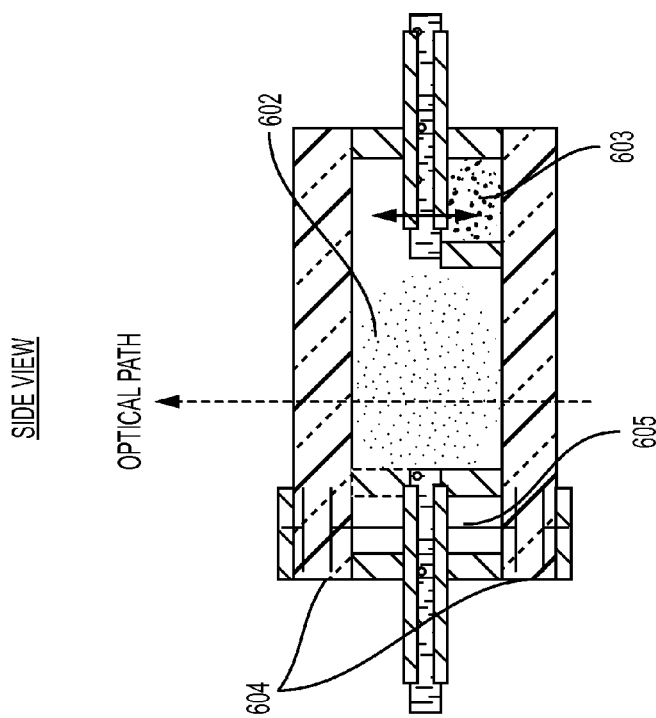
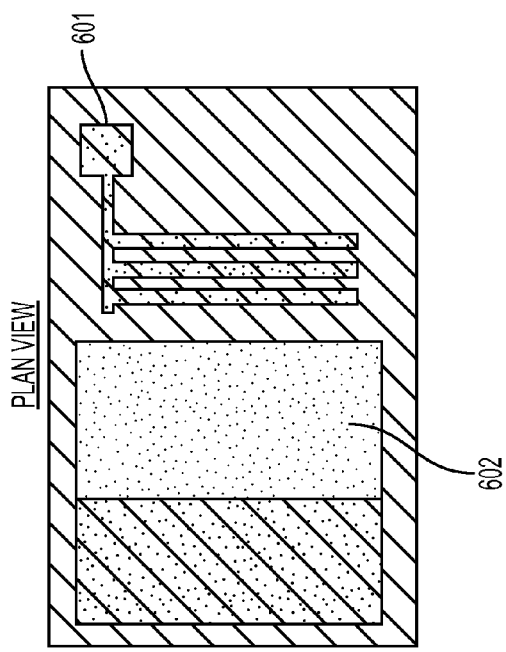
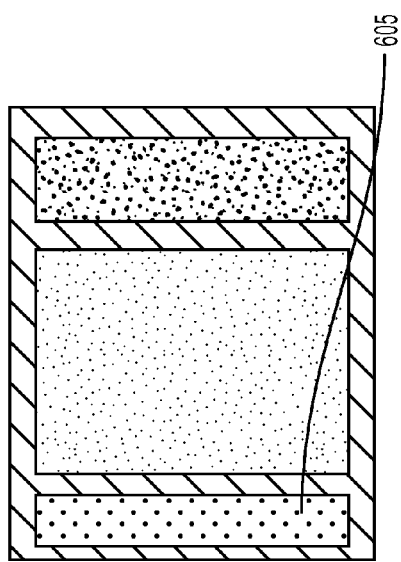

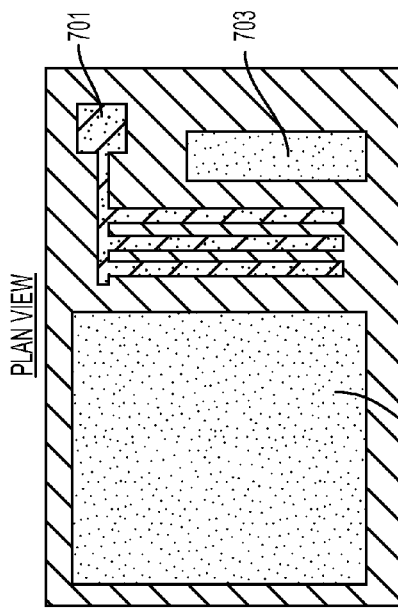
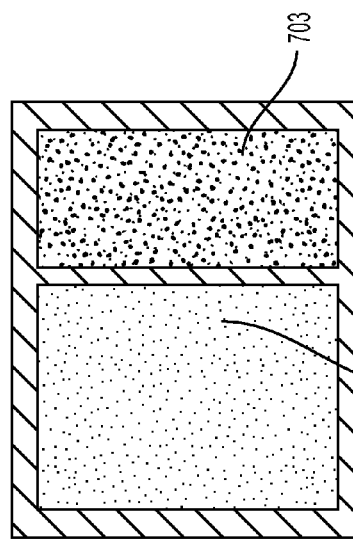
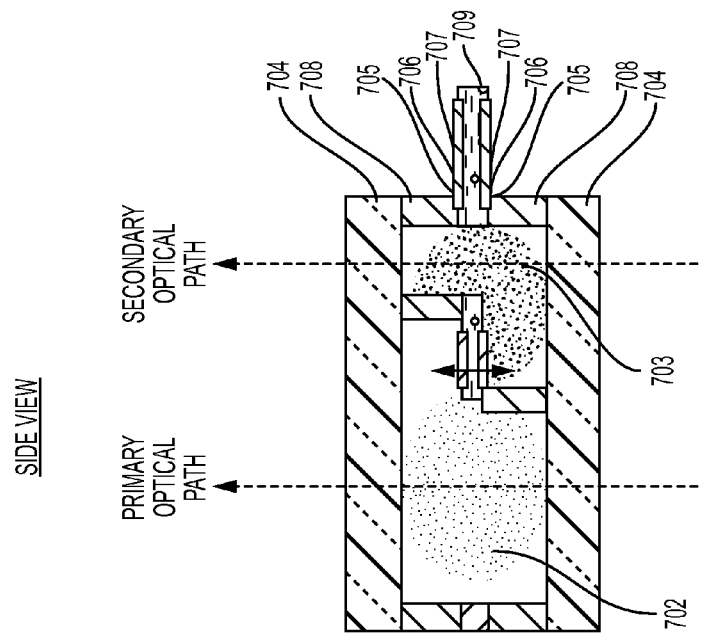
FIG. 7A
FIG. 7B
FIG. 7C

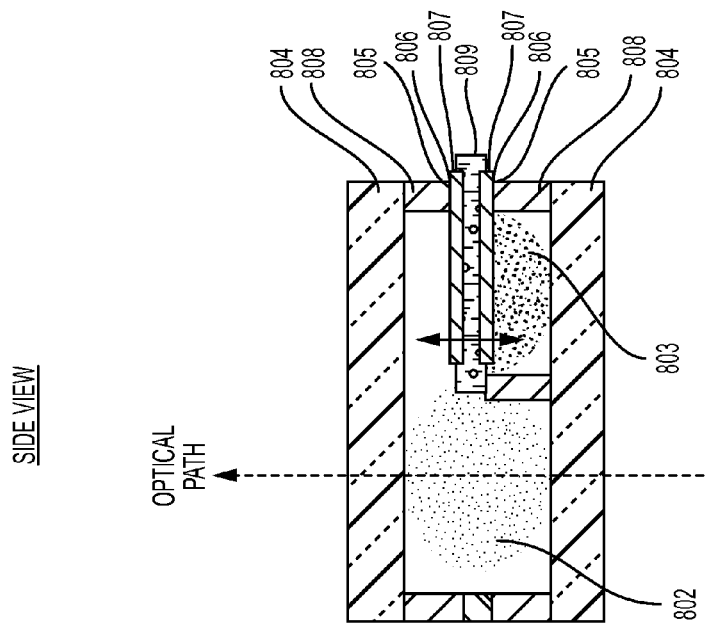
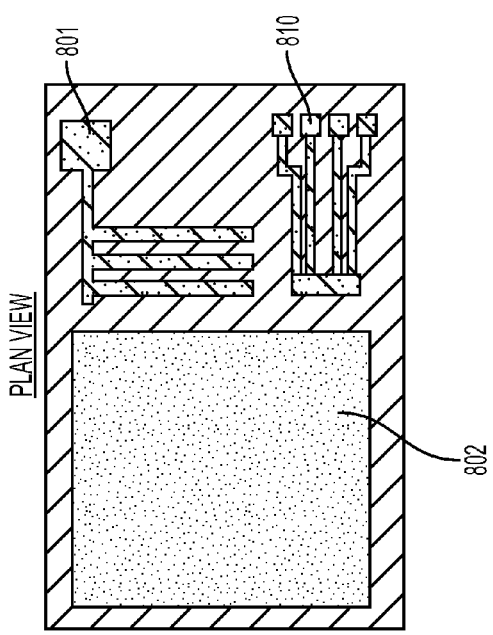
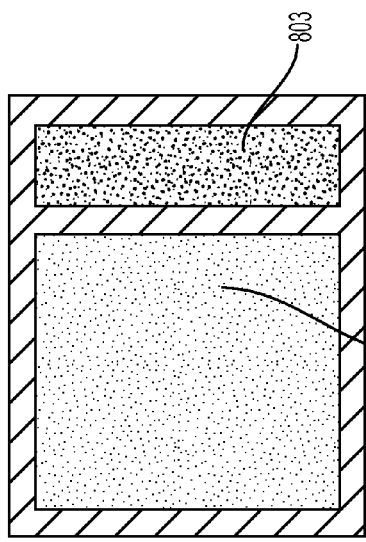

VAPOR CELLS WITH ELECTRICAL CONTROL OF VAPOR PRESSURE, AND METHODS OF USING THE VAPOR CELLS

PRIORITY DATA

This patent application is a non-provisional application with priority to U.S. Provisional Patent App. No. 62/062,200, filed Oct. 10, 2014, which is hereby incorporated by reference herein.

STATEMENT REGARDING FEDERALLY SPONSORED RESEARCH OR DEVELOPMENT

This invention was made with Government support under Contract No. N66001-15-C-4027. The Government has certain rights in this invention.

FIELD OF THE INVENTION

The present invention generally relates to alkali and alkaline earth vapor cells, systems containing vapor cells, and methods of using vapor cells.

BACKGROUND OF THE INVENTION

Alkali vapor-cells have been used extensively since the 1960s in the study of light-atom interactions. Vapor-cell applications, both proposed and realized, include atomic clocks, communication system switches and buffers, single-photon generators and detectors, gas-phase sensors, nonlinear frequency generators, and precision spectroscopy instrumentation. However, most of these applications have only been created in laboratory settings.

A key driver has been to reduce vapor-cell size. Traditional vapor-cell systems are large and, if they have thermal control, have many discrete components and consume a large amount of power. To realize the full potential of vapor-cell technologies, the vapor-cell systems need to be miniaturized.

Macroscale vapor cells are widely used in macro-scale atomic clocks and as spectroscopy references. They are typically 10-100 $cm^3$ in volume, which is insignificant for $m^3$ scale atomic clocks, but is far too large for chip-scale atomic clocks which are at most a few $cm^3$ in volume.

Chip-scale atomic clocks and navigation systems require miniature vapor cells, typically containing cesium or rubidium, with narrow absorption peaks that are stable over time. Miniature vapor cells, and methods of filling them with alkali metals, have been described in the prior art. However, it has proven difficult to load a precise amount of alkali metal and buffer gas into a miniature vapor cell through the methods described in the literature. Miniature vapor cells have higher surface-area-to-volume ratios than macro-scale vapor cells, and are more difficult to load than macroscale vapor cells.

Furthermore, once the alkali metal and buffer gas mixture is loaded into the vapor cell, the composition cannot be controlled. The only input that can be used to control the partial pressures of the alkali metal and of the buffer gas is temperature; however, temperature affects both partial pressures.

These known problems lead to a number of factors, including reverse reactions, helium diffusion into the vapor cell, and buffer and alkali diffusion out of the vapor cell. These factors contribute to insufficient long-term stability in miniature vapor cells.

There is a long-felt need for improved long-term frequency stability in vapor cells. What is desired, in particular, is independent control of the alkali vapor pressure in the vapor cell, i.e., independent from the system temperature.

SUMMARY OF THE INVENTION

The present invention addresses the aforementioned needs in the art, as will now be summarized and then further described in detail below.

In some variations, a vapor-cell system is provided, comprising:

an enclosed vapor-cell region containing a vapor-cell gas phase comprising a vapor-cell alkali or alkaline earth metal, wherein the vapor-cell region is configured to allow at least one vapor-cell optical path through the vapor-cell gas phase;

an enclosed reservoir region containing a reservoir alkali or alkaline earth metal, wherein the reservoir region is capable of vapor isolation from the vapor-cell region;

a solid electrolyte disposed in ionic communication between the vapor-cell region and the reservoir region;

a first electrode disposed between the solid electrolyte and the vapor-cell region; and a second electrode disposed between the solid electrolyte and the reservoir region, wherein the second electrode is electrically isolated from the first electrode.

In some embodiments, the vapor-cell alkali or alkaline earth metal is selected from the group consisting of Na, K, Cs, Rb, Sr, and combinations thereof. The vapor-cell alkali or alkaline earth metal may be isotopically enriched or isotopically pure, if desired.

In some embodiments, the vapor-cell gas phase further includes a vapor-cell buffer gas. For example, a vapor-cell buffer gas may be selected from the group consisting of Ar, Ne, Xe, He, Kr, $N_2$, $NH_3$, $CO_2$, $CH_4$, and combinations thereof.

The vapor-cell region may be fabricated with a vapor-cell-region enclosure material selected from the group consisting of silicon, $SiO_2$, fused silica, quartz, pyrex, a metal, a dielectric, and combinations thereof.

The reservoir alkali or alkaline earth metal may be selected from the group consisting of Na, K, Cs, Rb, Sr, and combinations thereof. The reservoir alkali or alkaline earth metal is preferably the same alkali or alkaline earth metal as the vapor-cell alkali or alkaline earth metal. In certain embodiments, the reservoir alkali or alkaline earth metal is different than the initial vapor-cell alkali or alkaline earth metal.

In some embodiments, the reservoir alkali or alkaline earth metal is present at a higher molar concentration in the reservoir region than the molar concentration of the vapor-cell alkali or alkaline earth metal in the vapor-cell region. The volume of the reservoir region is typically (but not necessarily) less than the volume of the vapor-cell region.

The reservoir region may be fabricated with a reservoir-region enclosure material selected from the group consisting of silicon, $SiO_2$, fused silica, quartz, pyrex, a metal, a dielectric, and combinations thereof. Optionally, the reservoir region is configured to allow an additional optical path through the reservoir region.

The solid electrolyte may include a material selected from the group consisting of alumina, β-alumina, β"-alumina, yttria-stabilized zirconia, NASICON, LISICON, KSICON, and combinations thereof. In certain embodiments of the invention, the solid electrolyte contains at least 90 wt % β"-alumina. The solid electrolyte may also include material that is at least partially ion-exchanged with an ionized version of the vapor-cell alkali or alkaline earth metal.

In some embodiments, the system further comprises an additional solid electrolyte disposed in ionic communication between the vapor-cell region and an external source of alkali or alkaline earth metal, for initial or periodic loading of the vapor-cell region with the vapor-cell alkali or alkaline earth metal. In these or other embodiments, the system may include another solid electrolyte disposed in ionic communication between the reservoir region and an external source of alkali or alkaline earth metal, for initial or periodic loading of the reservoir region with the reservoir alkali or alkaline earth metal.

The system may be contained within an oven configured with temperature control of the vapor-cell system temperature. In some embodiments, the system further includes a temperature-measurement device (e.g., a thin-film resistance temperature detector) for measuring the vapor-cell system temperature. The vapor-cell system temperature may be adjusted in response to the temperature measurement. For example, the system may include a heater to controllably increase ionic conductivity of the solid electrolyte.

In some embodiments, the system further comprises a membrane which is capable of membrane deflection as the pressure of the vapor-cell gas phase changes. The membrane deflection may be electrically or piezoelectrically detected, for example. In related embodiments, the system further comprises a membrane which is capable of membrane deflection as the pressure changes between the vapor-cell region and a reference-cell region having a known pressure.

In some embodiments, the reservoir region is configured to allow a reservoir-region optical path through the reservoir region. The system may be configured to provide a first laser beam directed to the vapor-cell optical path(s) and a second laser beam directed to the reservoir-region optical path. In some of these embodiments, the system includes a first laser source providing the first laser beam, and a second laser source providing the second laser beam. In other embodiments, the system includes a single laser source that is split to the first laser beam and the second laser beam. Some embodiments further include a sensor to detect an absorption difference between the first laser beam and the second laser beam, wherein the absorption difference is correlated to a difference in alkali or alkaline earth vapor pressure between the vapor-cell region and the reservoir region.

Other variations of the invention provide a method of operating a vapor-cell system, the method comprising:

providing a vapor-cell system comprising (i) an enclosed vapor-cell region containing a vapor-cell gas phase comprising a vapor-cell alkali or alkaline earth metal and optionally a vapor-cell buffer gas; (ii) an enclosed reservoir region containing a reservoir alkali or alkaline earth metal, wherein the reservoir region is capable of vapor isolation from the vapor-cell region; and (iii) a solid electrolyte disposed in ionic communication between the vapor-cell region and the reservoir region; and applying a voltage across two electrodes situated on opposite sides of the solid electrolyte, to control partial pressure of the vapor-cell alkali or alkaline earth metal at a set-point alkali partial pressure, wherein the set-point alkali or alkaline earth partial pressure is different from the equilibrium vapor pressure of the vapor-cell alkali or alkaline earth metal at the vapor-cell system temperature.

The vapor-cell region is typically configured to allow at least one vapor-cell optical path through the vapor-cell gas phase, and optionally an additional optical path through the reservoir region.

In some embodiments, the set-point alkali or alkaline earth partial pressure is at least ten times higher than the equilibrium vapor pressure of the vapor-cell alkali or alkaline earth metal at the vapor-cell system temperature. In different embodiments, the set-point alkali or alkaline earth partial pressure is at least ten times lower than the equilibrium vapor pressure of the vapor-cell alkali or alkaline earth metal at the vapor-cell system temperature.

The polarity of the voltage may be selected to control direction of alkali or alkaline earth atom flux, either from the reservoir region into the vapor-cell region, or from the vapor-cell region into the reservoir region. The amplitude of the voltage may be selected to control magnitude of alkali or alkaline earth atom flux.

The method may include applying an initial or periodic voltage across separate electrodes situated on opposite sides of an additional solid electrolyte, to initially or periodically load the reservoir region with the reservoir alkali metal. Alternatively or additionally, the method may include applying an initial or periodic voltage across separate electrodes situated on opposite sides of an additional solid electrolyte, to initially or periodically load the vapor-cell region with the vapor-cell alkali or alkaline earth metal.

The vapor-cell alkali or alkaline earth metal and the reservoir alkali or alkaline earth metal may each be selected from the group consisting of Na, K, Cs, Rb, Sr, and combinations thereof.

In some embodiments, the reservoir alkali or alkaline earth metal is present at a higher molar concentration in the reservoir region than the molar concentration of the vapor-cell alkali or alkaline earth metal in the vapor-cell region. Optionally, the set-point temperature and concentration of the vapor-cell alkali or alkaline earth metal are selected to ensure atoms of the vapor-cell alkali or alkaline earth metal are substantially in the vapor phase.

Some methods further include adjusting the vapor-cell system temperature to a set-point temperature. When a buffer gas is present in the vapor-cell region, the partial pressure of the vapor-cell buffer gas may be controlled by the set-point temperature. A vapor-cell buffer gas (if present) may be selected from the group consisting of Ar, Ne, Xe, He, Kr, $N_2$, $NH_3$, $CO_2$, $CH_4$, and combinations thereof.

The solid electrolyte may be selected from the group consisting of alumina, β-alumina, β"-alumina, yttria-stabilized zirconia, NASICON, LISICON, KSICON, and combinations thereof. The solid electrolyte may include a material that is at least partially ion-exchanged with an ionized version of the vapor-cell alkali or alkaline earth metal, initially and/or after a period of time following operation.

BRIEF DESCRIPTION OF THE DRAWINGS

FIG. 6A is a schematic plan view of a vapor-cell system with a pressure-measurement membrane and a reference pressure cell, in some embodiments.

FIG. 6B is a schematic plan view of a vapor-cell system with a pressure-measurement membrane and a reference pressure cell, in some embodiments.

FIG. 6C is a schematic side view of a vapor-cell system with a pressure-measurement membrane and a reference pressure cell, in some embodiments.

FIG. 7A is a schematic plan view of a vapor-cell system a secondary optical path to monitor alkali or alkaline earth vapor pressure in the reservoir region, in some embodiments FIG. 7B is a schematic plan view of a vapor-cell system with a secondary optical path to monitor alkali or alkaline earth vapor pressure in the reservoir region, in some embodiments.

FIG. 7C is a schematic side view of a vapor-cell system with a secondary optical path to monitor alkali or alkaline earth vapor pressure in the reservoir region, in some embodiments.

FIG. 8A is a schematic plan view a vapor-cell system with a resistance temperature detector, in some embodiments.

FIG. 8B is a schematic plan view a vapor-cell system with a resistance temperature detector, in some embodiments.

FIG. 8C is a schematic side view a vapor-cell system with a resistance temperature detector, in some embodiments.

DETAILED DESCRIPTION OF EMBODIMENTS OF THE INVENTION

Figure 1:
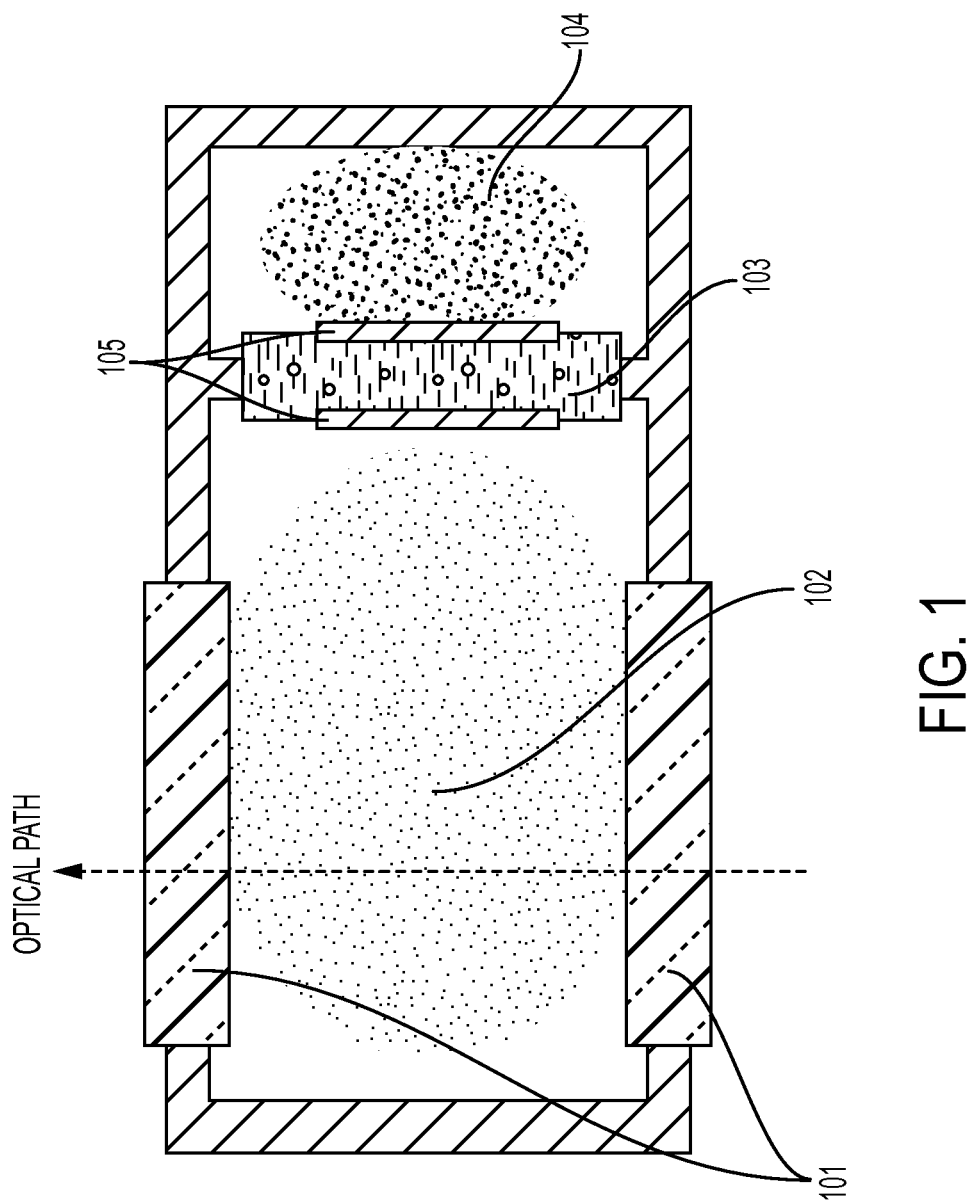
FIG. 1 is a general schematic of a vapor-cell system, in some embodiments of the invention.

The structures, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Variations of the invention are premised on vapor cells having independent alkali (or alkaline earth) vapor pressure control. Generally, an alkali metal or alkaline earth metal vapor cell is configured with a solid electrolyte which is used to transport alkali or alkaline earth atoms between the vapor cell and a reserve reservoir, thus enabling electrical control over alkali or alkaline earth content of the vapor cell. The solid electrolyte can control the alkali or alkaline earth vapor pressure within the vapor cell.

The invention disclosed overcomes problems described above in the Background, through independent control of the alkali or alkaline earth vapor pressure in the vapor cell. This is enabled by connecting the vapor cell to an alkali or alkaline earth reservoir, via a solid electrolyte. Alkali or alkaline earth atoms can be transported from the reservoir to the vapor cell (or vice-versa) by applying a voltage across the solid electrolyte.

When combined with the typical vapor cell oven, this enables independent control over the alkali or alkaline earth partial pressure and an optional buffer gas partial pressure in the vapor cell. In some embodiments, the buffer gas partial pressure is controlled by the oven temperature and the alkali or alkaline earth partial pressure is controlled by the voltage and current applied across the solid electrolyte. As conditions in the vapor cell change over time, the oven temperature and alkali or alkaline earth partial pressure can be adjusted to maintain a narrow, stable absorption peak.

Because the alkali or alkaline earth concentration may be adjusted after the vapor cell is sealed, the present invention obviates the need for precision loading of alkali or alkaline earth metal when the vapor cell is sealed, thus making the sealing process significantly easier. Furthermore, variations of the present invention enables independent control of alkali or alkaline earth vapor partial pressure and buffer gas partial pressure throughout the lifetime of the vapor cell.

Variations of this invention enable a miniature vapor cell with a narrow, stable absorption peak. A miniature vapor cell with a narrow, stable absorption peak may be useful for miniature position, navigation, and timing systems, among other uses.

A vapor-cell region contains an alkali metal (e.g. Na, K, Cs, or Rb) and/or an alkaline earth metal (e.g., Be, Mg, Ca, or Sr), in the gas phase. The alkali or alkaline earth metal may be isotopically enriched, which means the relative abundance of the isotopes of a given element are altered, thus producing a form of the element that has been enriched in one particular isotope and depleted in its other isotopic forms. The alkali or alkaline earth metal may be isotopically pure, which means it is composed entirely of one isotope of the selected alkali or alkaline earth metal.

The vapor cell may contain a buffer gas (e.g. $N_2$, $CH_4$, Ar, Ne, Xe, $NH_3$, or mixtures of these or other molecules). The buffer gas is preferably not reactive with the alkali or alkaline earth metal.

Walls enclose the vapor-cell region, sealing it from the ambient environment. The walls may be fabricated from silicon, $SiO_2$, fused silica, quartz, pyrex, metals, dielectrics, or a combination thereof, for example. At least one of the walls includes a substantially transparent portion such that there is an optical path through the vapor-cell region. A wall can be made transparent either by fabricating from an optically transparent material, or by including an optical window in a part of the wall.

The reservoir region also contains an alkali metal (e.g. Na, K, Cs, or Rb) and/or an alkaline earth metal (e.g., Be, Mg, Ca, or Sr). The reservoir region and the vapor-cell region preferably contain the same alkali or alkaline earth metal atoms, but that is not necessary.

The reservoir region should be capable of vapor isolation from the vapor-cell region. By "capable of vapor isolation" as intended herein, it is meant that the vapor-cell region and the reservoir region can be configured such that vapor cannot freely flow (by convection or diffusion, referred to herein individually or collectively as "vapor communication") between the vapor-cell region and the reservoir region. In some embodiments, a reservoir region is designed such that it is not ever in vapor communication with the vapor-cell region-unless there is some sort of leak or structural damage to the system. In certain embodiments, a closable valve is placed between the vapor-cell region and the reservoir region. In such embodiments, when the valve is optionally opened, the vapor-cell region and the reservoir region will temporarily be in vapor communication. However, the valve (if present) is normally closed, making the reservoir region in vapor isolation from the vapor-cell region.

In some embodiments, the concentration of the alkali or alkaline earth metal in the reservoir region is greater than that of the vapor-cell region. In these or other embodiments, the volume of the reservoir region is smaller than that of the vapor-cell region. The total number of atoms of alkali or alkaline earth metal in the reservoir region may be larger or smaller than the total number of atoms of alkali or alkaline earth metal in the vapor-cell region. The alkali or alkaline earth metal atoms in the reservoir region are preferably in the vapor phase, but they may also be present in a liquid phase and/or a solid phase contained in the reservoir region.

Walls enclose the reservoir region, sealing it from the ambient environment. The walls may be fabricated from silicon, $SiO_2$, fused silica, quartz, pyrex, metals, dielectrics, or a combination thereof, for example. Optionally, at least one of the walls includes a substantially transparent portion such that there is an optical path through the reservoir region.

A solid electrolyte is disposed between the vapor-cell region and to the reservoir region. In preferred embodiments, the solid electrolyte comprises or consists essentially of solid β-alumina and/or β"-alumina. Beta-alumina solid electrolyte (BASE) is a fast ion-conductor material used as a membrane in several types of electrochemical cells. β-alumina and β"-alumina are good conductors of their mobile ions yet allows negligible non-ionic (i.e., electronic) conductivity. β"-alumina is a hard polycrystalline or monocrystalline ceramic which, when prepared as an electrolyte, is complexed with a mobile ion, such as Na+, K+, Li+, or an ionic version of the alkali or alkaline earth metal.

Other possible solid electrolyte materials include yttria-stabilized zirconia, NASICON, LISICON, KSICON, and combinations thereof. In some embodiments, the solid electrolyte has an ionic conductivity at 25° C. of about 0.0001 S/cm, 0.001 S/cm, 0.01 S/cm, 0.1 S/cm, 1 S/cm, or higher. In some embodiments, the solid electrolyte has an electronic conductivity at 25° C. less than about 0.01 S/cm, less than about 0.0001 S/cm, or less than $10^{-6}$ S/cm.

At least two electrodes are generally present in the system. One electrode is connected to the solid electrolyte and to the vapor-cell region. Another electrode is connected to the solid electrolyte and to the reservoir region. The second electrode is electrically isolated from the first electrode. That is, there should not be an electrically conductive path between the two electrodes in the system. Dielectric materials may be employed to isolate and electrically insulate the electrodes from other parts of the system.

The vapor cell is typically contained within an oven which can control the temperature of the vapor-cell system. In some embodiments, the vapor-cell region is contained in an oven while the reservoir region is not, or is contained in a different thermal zone.

There are many options and alternatives that will be apparent to one skilled in the art.

A second solid electrolyte could be connected between either the vapor cell and the ambient or the reservoir and the ambient. There are two electrodes associated with this second solid electrolyte, one on each side. This second solid electrolyte could be used to load alkali or alkaline earth metal into the vapor-cell region or into the reservoir region. The alkali or alkaline earth loading operation may be done at the beginning of the life of the vapor-cell system. Also, the alkali or alkaline earth loading operation may be repeated periodically through the life of the vapor-cell system. This loading operation is easier than loading a precise amount of alkali or alkaline earth vapor into an unsealed vapor cell and then sealing the vapor cell. An impermeable (or reduced permeability) layer could be placed over the solid electrolyte after loading to eliminate or reduce the diffusion of alkali or alkaline earth vapor out of the vapor-cell region and/or out of the reservoir region.

The system may include one or more heaters to temporarily increase the ionic conductivity of the solid electrolyte.

The system could include one or more temperature measurement devices, such as thin-film resistance temperature detectors.

The system may include a membrane which deflects as the pressure inside the vapor cell changes. The deflection could be read out with an electrical signal (e.g. piezoelectric, capacitive, differential capacitive, etc.). The membrane could deflect as the pressure between the vapor cell and a reference cell changes. The reference cell may contain vacuum or may contain a substance in vapor-solid or vapor-liquid equilibrium such that the pressure inside the reference cell would be known by knowing the temperature of the reference cell.

The system may be configured to allow a secondary optical path through the reservoir region. Multiple laser beams may be employed, or the beam of a single laser may be split to interrogate both the primary and secondary optical paths. The difference in absorption between the two paths may be used to sense the difference in alkali or alkaline earth vapor pressure between the two chambers. If the alkali or alkaline earth in the reservoir is in a vapor-liquid or solid-vapor equilibrium, then the vapor pressure in the reservoir is known if the temperature of the reservoir is known. Thus, the vapor pressure of the alkali or alkaline earth in the vapor cell can be determined by knowing the difference in absorption between the two optical paths and the temperature of the reservoir.

FIG. 1 is a general schematic of a vapor-cell system, in some embodiments. The vapor-cell system is configured with optical windows 101, which allow an optical path (dotted line in FIG. 1). In this case, the optical path traverses through each of the optical windows 101. The system of FIG. 1 includes an alkali or alkaline earth vapor cell region 102, an alkali or alkaline earth reservoir region 104, and a solid electrolyte 103 with electrodes 105.

As intended herein, an "optical path" is the path of a spectroscopic probing beam of light (or other type of laser beam) through the alkali or alkaline earth vapor-cell region, or in some cases, through the reservoir region. In this specification, the optical path is optional in the sense that the device itself does not include the beam of light, while operation of the device will at least periodically mean that an optical path is traversing through the alkali or alkaline earth vapor-cell region, as depicted in FIG. 1 and other drawings herein. Also note that an optical path is not necessarily a straight line. Internal reflectors may be included in the system, so that optical reflection occurs. In that case, the optical beam could enter and exit along the same wall (detection probe on the same side as the laser source), for example.

Figure 2:
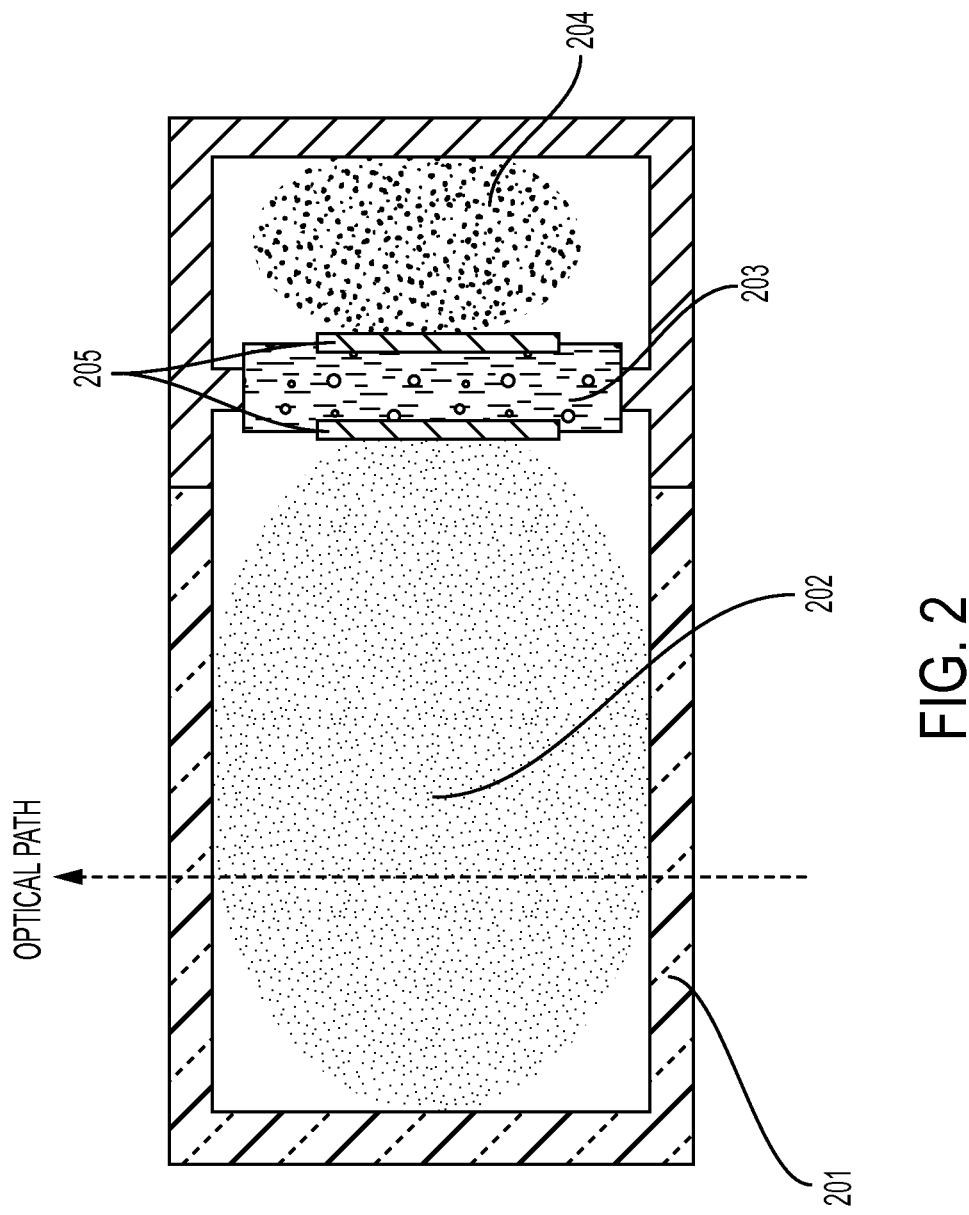
FIG. 2 is a general schematic of a vapor-cell system, in some embodiments.

FIG. 2 is a general schematic of a vapor-cell system, in some embodiments. The vapor-cell system is configured with an optically transparent wall 201, which allows an optical path (dotted line in FIG. 2). The optically transparent wall 201 could be a cuvette, for example. A cuvette is a small tube of circular or square cross section, made of plastic, glass, or fused quartz and designed to hold samples for spectroscopic experiments. The system of FIG. 2 includes an alkali or alkaline earth vapor-cell region 202, an alkali or alkaline earth reservoir region 204, and a solid electrolyte 203 with electrodes 205.

Figure 3:
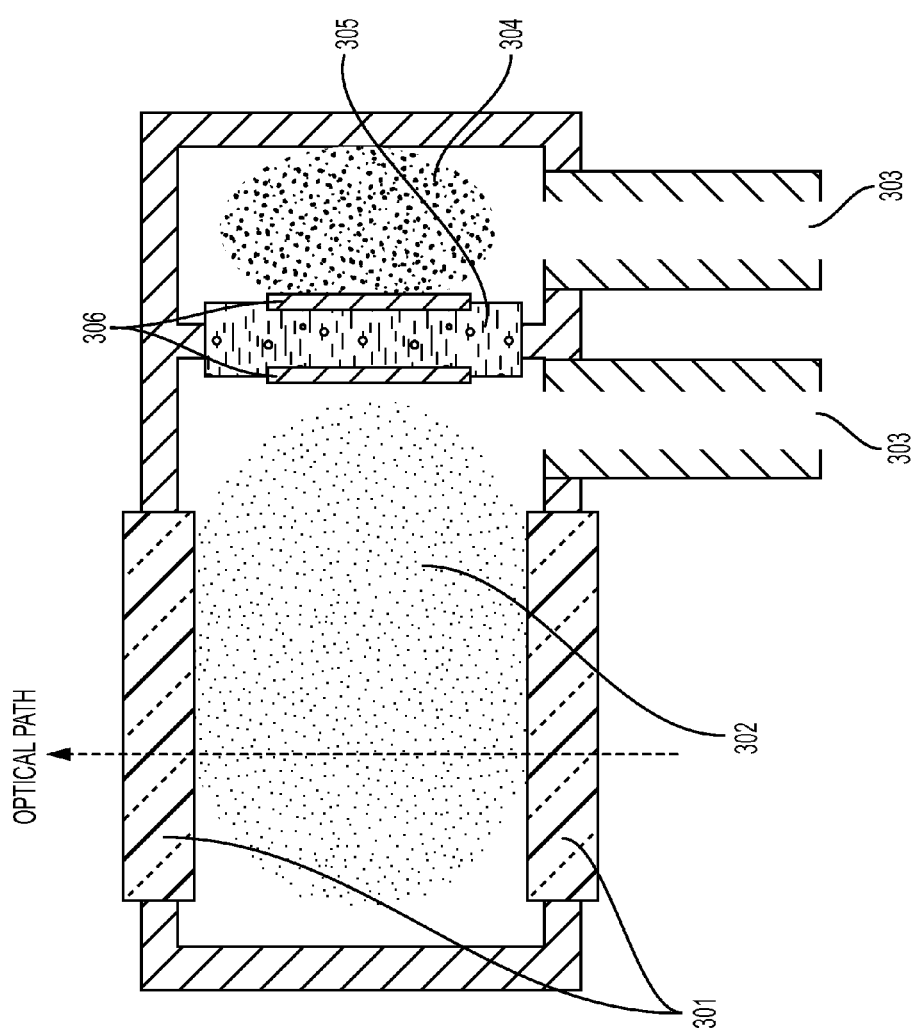
FIG. 3 is a general schematic of a vapor-cell system, in some embodiments wherein the vapor cell is not always sealed.

FIG. 3 is a general schematic of a vapor-cell system, in some embodiments wherein the vapor cell is not always sealed. The vapor-cell system is configured with optical windows 301, which allow an optical path (dotted line in FIG. 3). The system includes an alkali or alkaline earth vapor-cell region 302, an alkali or alkaline earth reservoir region 304, and solid electrolyte 305 with electrodes 306. The system of FIG. 3 further includes two ports 303, which are configured (e.g., with valves and pumps) to convey vapor into or out of each of the alkali or alkaline earth vapor-cell region 302 or alkali or alkaline earth reservoir region 304.

Figure 4C:
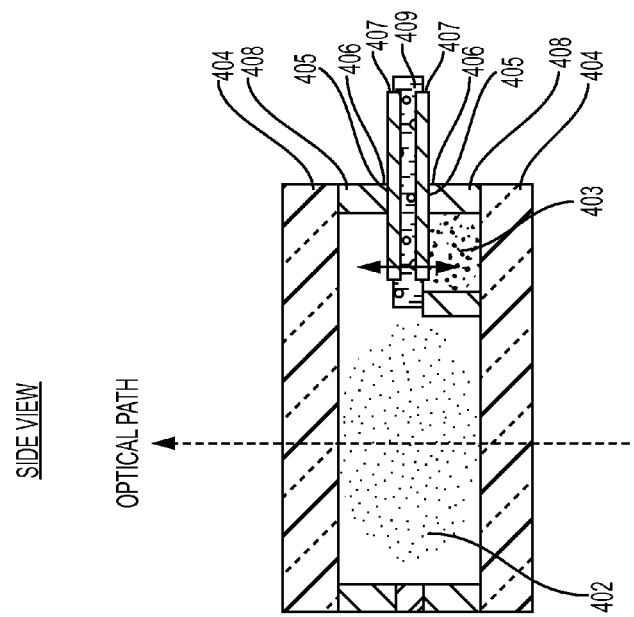
FIG. 4C is a schematic side view of a vapor-cell system, in some embodiments.
Figure 4A:
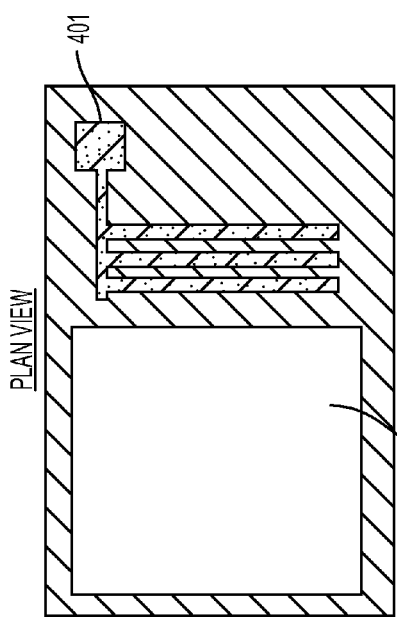
FIG. 4A is a schematic plan view of a vapor-cell system, in some embodiments.
Figure 4B:
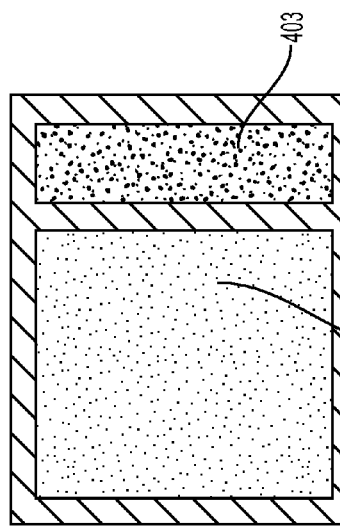
FIG. 4B is a schematic plan view of a vapor-cell system, in some embodiments.

FIGS. 4A-4C are several schematic views of a vapor-cell system. FIGS. 4A and 4B are plan views, while FIG. 4C is a side view. In FIG. 4A, a top electrode 401 is shown adjacent to an alkali or alkaline earth vapor-cell region 402. In FIG. 4B, the alkali or alkaline earth vapor-cell region 402 is disposed physically close to, but in vapor isolation from, an alkali or alkaline earth reservoir region 403. FIG. 4C includes the alkali or alkaline earth vapor-cell region 402 and the alkali or alkaline earth reservoir region 403, along with walls 404 (e.g., pyrex), bonding materials 405, dielectric materials 406, electrodes 407 (the upper electrode 407 contains a portion of top electrode 401 in FIG. 4A), walls 408 (e.g., Si), and solid electrolyte 409 (e.g., β"-alumina). The walls 404 are configured to allow an optical path (dotted line in FIG. 4C), either by including optical windows, or being fabricated from optically transparent material. The double arrow shown on the left-hand side of the solid electrolyte 409 indicates that alkali or alkaline earth atoms are able to transport either from the reservoir region 403 to the vapor-cell region 402, or vice-versa, by applying a voltage across the two electrodes 407 situated on opposite sides of the solid electrolyte 409.

Figure 5C:
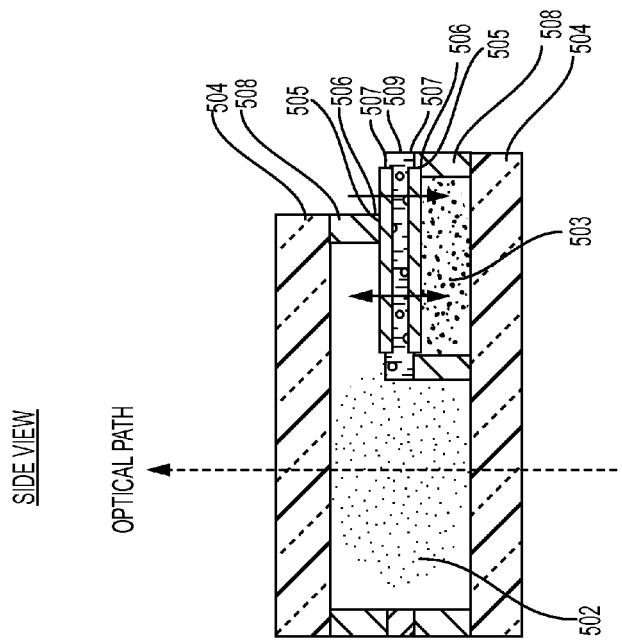
FIG. 5C is a schematic side view of a vapor-cell system with a solid electrolyte membrane for initial alkali or alkaline earth loading, in some embodiments.
Figure 5A:
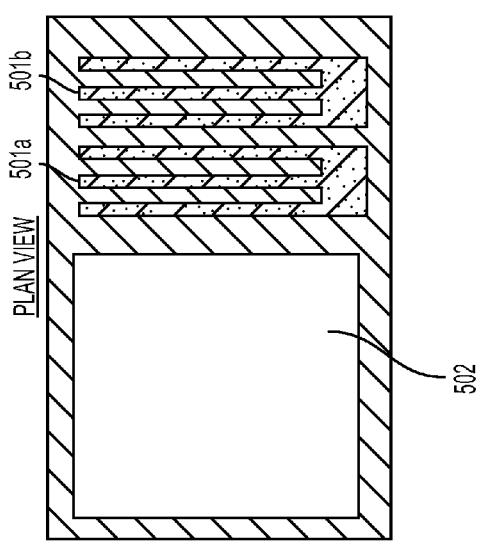
FIG. 5A is a schematic plan view of a vapor-cell system with a solid electrolyte membrane for initial alkali or alkaline earth loading, in some embodiments.
Figure 5B:
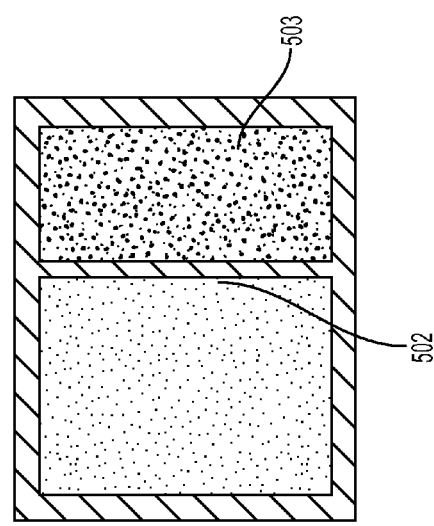
FIG. 5B is a schematic plan view of a vapor-cell system with a solid electrolyte membrane for initial alkali or alkaline earth loading, in some embodiments.

FIGS. 5A-5C are several schematic views of a vapor-cell system with a solid electrolyte membrane for initial alkali or alkaline earth loading. In FIG. 5A, top electrodes 501a/501b are shown adjacent to an alkali or alkaline earth vapor-cell region 502. Top electrode 501a is a control electrode and top electrode 501b is a loading electrode. In FIG. 5B, the alkali or alkaline earth vapor-cell region 502 is disposed physically close to, but in vapor isolation from, an alkali or alkaline earth reservoir region 503. FIG. 5C includes the alkali or alkaline earth vapor-cell region 502 and the alkali or alkaline earth reservoir region 503, along with walls 504 (e.g., pyrex), bonding materials 505, dielectric materials 506, electrodes 507 (the upper electrode 507 contains a portion of control electrode 501a and a portion of loading electrode 501b in FIG. 5A), walls 508 (e.g., Si), and solid electrolyte 509 (e.g., β"-alumina). The walls 504 are configured to allow an optical path (dotted line in FIG. 5C), either by including optical windows, or being fabricated from optically transparent material. The double arrow shown on the left-hand side of the solid electrolyte 509 indicates that alkali or alkaline earth atoms are able to transport either from the reservoir region 503 to the vapor-cell region 502, or vice-versa, by applying a voltage across the two electrodes 507 situated on opposite sides of the solid electrolyte 509. The single arrow shown on the right-hand side of the solid electrolyte 509 indicates that alkali or alkaline earth atoms are able to be introduced directly into the reservoir region 503.

FIGS. 6A-6C are several schematic views of a vapor-cell system having independent alkali or alkaline earth vapor-pressure control, with a pressure-measurement membrane and a reference pressure cell. In FIG. 6A, a top electrode 601 is shown adjacent to an alkali or alkaline earth vapor-cell region 602. In FIG. 6B, the alkali or alkaline earth vapor-cell region 602 is disposed physically close to, but in vapor isolation from, an alkali or alkaline earth reservoir region 603. The walls of the vapor-cell region 602 are configured to allow an optical path (dotted line in FIG. 6C), either by including optical windows, or being fabricated from optically transparent material. A reference pressure cell 605 is disposed physically close to, but in vapor isolation from, the alkali or alkaline earth vapor-cell region 602. The reference pressure cell 605 is configured with variable capacitors 604 (or other sensors) to provide a differential capacitive pressure measurement.

FIGS. 7A-7C are several schematic views of a vapor-cell system having independent alkali or alkaline earth vapor-pressure control, with a secondary optical path to monitor alkali or alkaline earth vapor pressure in the reservoir region. FIGS. 7A and 7B are plan views, while FIG. 7C is a side view. In FIG. 7A, a top electrode 701 is shown adjacent to an alkali or alkaline earth vapor-cell region 702. In FIG. 7B, the alkali or alkaline earth vapor-cell region 702 is disposed physically close to, but in vapor isolation from, an alkali or alkaline earth reservoir region 703. FIG. 7C includes the alkali or alkaline earth vapor-cell region 702 and the alkali or alkaline earth reservoir region 703, along with walls 704 (e.g., pyrex), bonding materials 705, dielectric materials 706, electrodes 707 (the upper electrode 707 contains a portion of top electrode 701 in FIG. 7A), walls 708 (e.g., Si), and solid electrolyte 709 (e.g., β"-alumina). The walls 704 are configured to allow a primary optical path through the vapor-cell region 702 as well as a secondary optical path through the reservoir region 703 (dotted lines in FIG. 7C), either by including optical windows, or being fabricated from optically transparent material. The double arrow shown on the left-hand side of the solid electrolyte 709 indicates that alkali or alkaline earth atoms are able to transport either from the reservoir region 703 to the vapor-cell region 702, or vice-versa, by applying a voltage across the two electrodes 707 situated on opposite sides of the solid electrolyte 709.

FIGS. 8A-8C are several schematic views of a vapor-cell system having independent alkali or alkaline earth vapor-pressure control, with a resistance temperature detector (RTD). FIGS. 8A and 8B are plan views, while FIG. 8C is a side view. In FIG. 8A, a top electrode 801 is shown adjacent to an alkali or alkaline earth vapor-cell region 802. A resistance temperature detector 810 is disposed near the top electrode 801, to provide a measured vapor-cell system temperature. In FIG. 8B, the alkali or alkaline earth vapor-cell region 802 is disposed physically close to, but in vapor isolation from, an alkali or alkaline earth reservoir region 803. FIG. 8C includes the alkali or alkaline earth vapor-cell region 802 and the alkali or alkaline earth reservoir region 803, along with walls 804 (e.g., pyrex), bonding materials 805, dielectric materials 806, electrodes 807 (the upper electrode 807 contains a portion of top electrode 801 in FIG. 8A), walls 808 (e.g., Si), and solid electrolyte 809 (e.g., β"-alumina). The walls 804 are configured to allow an optical path (dotted line in FIG. 8C), either by including optical windows, or being fabricated from optically transparent material. The double arrow shown on the left-hand side of the solid electrolyte 809 indicates that alkali or alkaline earth atoms are able to transport either from the reservoir region 803 to the vapor-cell region 802, or vice-versa, by applying a voltage across the two electrodes 807 situated on opposite sides of the solid electrolyte 809.

Figure 9C:
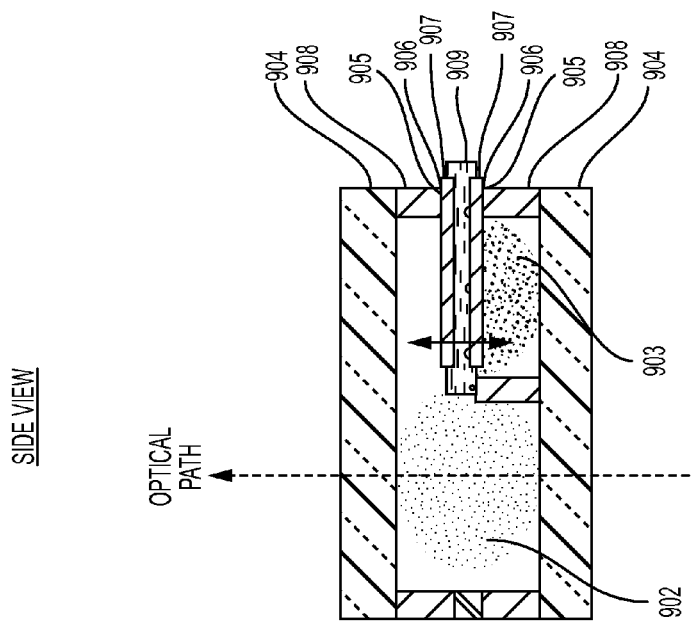
FIG. 9C is a schematic side view of a vapor-cell system with a heater, in some embodiments.
Figure 9A:
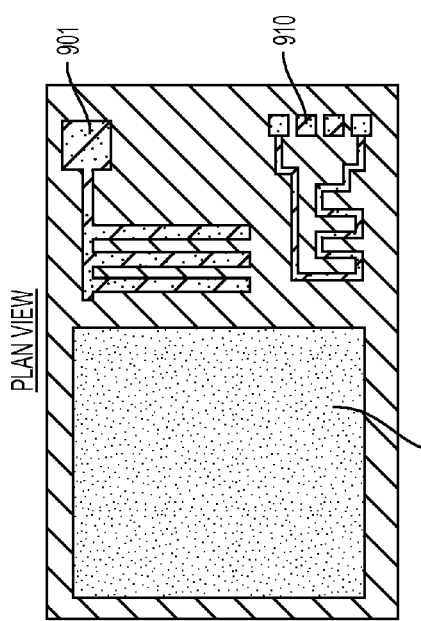
FIG. 9A is a schematic plan view of a vapor-cell system with a heater, in some embodiments.
Figure 9B:
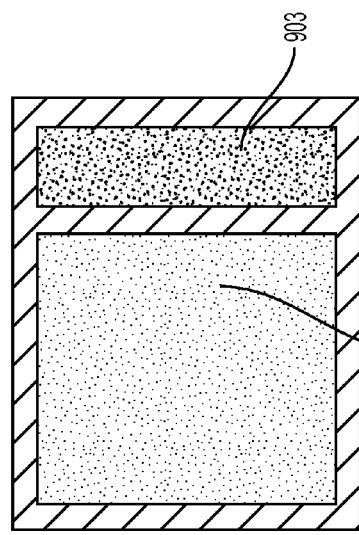
FIG. 9B is a schematic plan view of a vapor-cell system with a heater, in some embodiments.

FIGS. 9A-9C are several schematic views of a vapor-cell system having independent alkali or alkaline earth vapor-pressure control, with a heater. FIGS. 9A and 9B are plan views, while FIG. 9C is a side view. In FIG. 9A, a top electrode 901 is shown adjacent to an alkali or alkaline earth vapor-cell region 902. A resistance heater 910 is disposed near the top electrode 901, to provide a measured vapor-cell system temperature. In FIG. 9B, the alkali or alkaline earth vapor-cell region 902 is disposed physically close to, but in vapor isolation from, an alkali or alkaline earth reservoir region 903. FIG. 9C includes the alkali or alkaline earth vapor-cell region 902 and the alkali or alkaline earth reservoir region 903, along with walls 904 (e.g., pyrex), metal bonds 905, dielectric materials 906, electrodes 907 (the upper electrode 907 contains a portion of top electrode 901 in FIG. 9A), walls 908 (e.g., Si), and solid electrolyte 909 (e.g., (3"-alumina). The walls 904 are configured to allow an optical path (dotted line in FIG. 9C), either by including optical windows, or being fabricated from optically transparent material. The double arrow shown on the left-hand side of the solid electrolyte 909 indicates that alkali or alkaline earth atoms are able to transport either from the reservoir region 903 to the vapor-cell region 902, or vice-versa, by applying a voltage across the two electrodes 907 situated on opposite sides of the solid electrolyte 909.

Some variations provide a method of operating a vapor-cell system. In some embodiments, a voltage is applied for a given duration across two electrodes that are situated on opposite sides of a solid electrolyte. This electrical input causes the transport of alkali or alkaline earth atoms from an ambient source into a reservoir region.

The temperature of an oven may be set to control the temperature of the vapor cell at a set-point temperature. The partial pressure of the buffer gas (if present) may be controlled by the set-point temperature. The set-point temperature and the concentration of the alkali or alkaline earth metal in the vapor-cell region may be chosen, in some embodiments, such that all of the alkali or alkaline earth atoms are in the vapor phase (i.e. none are in the liquid phase or solid phase).

A voltage may be applied for a given duration across two electrodes that are situated on opposite sides of a solid electrolyte, to control the partial pressure of the alkali or alkaline earth metal in the vapor cell at a set-point partial pressure. The voltage polarity is selected to control the direction of alkali or alkaline earth atom flux (either from the reservoir into the vapor cell or from the vapor cell into reservoir). The voltage amplitude is selected to control the alkali or alkaline earth atom flux.

In some variations, a vapor-cell system is provided, comprising:

an enclosed vapor-cell region containing a vapor-cell gas phase comprising a vapor-cell alkali or alkaline earth metal, wherein the vapor-cell region is configured to allow at least one vapor-cell optical path through the vapor-cell gas phase;

an enclosed reservoir region containing a reservoir alkali or alkaline earth metal, wherein the reservoir region is capable of vapor isolation from the vapor-cell region;

a solid electrolyte disposed in ionic communication between the vapor-cell region and the reservoir region;

a first electrode disposed between the solid electrolyte and the vapor-cell region; and a second electrode disposed between the solid electrolyte and the reservoir region, wherein the second electrode is electrically isolated from the first electrode.

In some embodiments, the vapor-cell alkali or alkaline earth metal is selected from the group consisting of Na, K, Cs, Rb, Sr, and combinations thereof. The vapor-cell alkali or alkaline earth metal may be isotopically enriched or isotopically pure, if desired.

In some embodiments, the vapor-cell gas phase further includes a vapor-cell buffer gas. For example, a vapor-cell buffer gas may be selected from the group consisting of Ar, Ne, Xe, He, Kr, $N_2$, $NH_3$, $CO_2$, $CH_4$, and combinations thereof.

The vapor-cell region may be fabricated with a vapor-cell-region enclosure material selected from the group consisting of silicon, $SiO_2$, fused silica, quartz, pyrex, a metal, a dielectric, and combinations thereof.

The reservoir alkali or alkaline earth metal may be selected from the group consisting of Na, K, Cs, Rb, Sr, and combinations thereof. The reservoir alkali or alkaline earth metal is preferably the same alkali or alkaline earth metal as the vapor-cell alkali or alkaline earth metal. In certain embodiments, the reservoir alkali or alkaline earth metal is different than the initial vapor-cell alkali or alkaline earth metal.

In some embodiments, the reservoir alkali or alkaline earth metal is present at a higher molar concentration in the reservoir region than the molar concentration of the vapor-cell alkali or alkaline earth metal in the vapor-cell region. The volume of the reservoir region is typically (but not necessarily) less than the volume of the vapor-cell region.

The reservoir region may be fabricated with a reservoir-region enclosure material selected from the group consisting of silicon, $SiO_2$, fused silica, quartz, pyrex, a metal, a dielectric, and combinations thereof. Optionally, the reservoir region is configured to allow an additional optical path through the reservoir region.

The solid electrolyte may include a material selected from the group consisting of alumina, β-alumina, β"-alumina, yttria-stabilized zirconia, NASICON, LISICON, KSICON, and combinations thereof. In certain embodiments of the invention, the solid electrolyte contains at least 50 wt %, 60 wt %, 70 wt %, 80 wt %, 90 wt %, 95 wt %, 99 wt %, or 99.9 wt % β"-alumina. The solid electrolyte may also include material that is at least partially ion-exchanged with an ionized version of the vapor-cell alkali or alkaline earth metal, initially and/or after a period of time following operation.

In some embodiments, the system further comprises an additional solid electrolyte disposed in ionic communication between the vapor-cell region and an external source of alkali or alkaline earth metal, for initial or periodic loading of the vapor-cell region with the vapor-cell alkali or alkaline earth metal. In these or other embodiments, the system may include another solid electrolyte disposed in ionic communication between the reservoir region and an external source of alkali or alkaline earth metal, for initial or periodic loading of the reservoir region with the reservoir alkali or alkaline earth metal.

The system may be contained within an oven configured with temperature control of the vapor-cell system temperature. In some embodiments, the system further includes a temperature-measurement device (e.g., a thin-film resistance temperature detector) for measuring the vapor-cell system temperature. The vapor-cell system temperature may be adjusted in response to the temperature measurement. For example, the system may include a heater to controllably increase ionic conductivity of the solid electrolyte.

In some embodiments, the system further comprises a membrane which is capable of membrane deflection as the pressure of the vapor-cell gas phase changes. The membrane deflection may be electrically or piezoelectrically detected, for example. In related embodiments, the system further comprises a membrane which is capable of membrane deflection as the pressure changes between the vapor-cell region and a reference-cell region having a known pressure.

In some embodiments, the reservoir region is configured to allow a reservoir-region optical path through the reservoir region. The system may be configured to provide a first laser beam directed to the vapor-cell optical path(s) and a second laser beam directed to the reservoir-region optical path. In some of these embodiments, the system includes a first laser source providing the first laser beam, and a second laser source providing the second laser beam. In other embodiments, the system includes a single laser source that is split to the first laser beam and the second laser beam. Some embodiments further include a sensor to detect an absorption difference between the first laser beam and the second laser beam, wherein the absorption difference is correlated to a difference in alkali or alkaline earth vapor pressure between the vapor-cell region and the reservoir region.

Other variations of the invention provide a method of operating a vapor-cell system, the method comprising:

providing a vapor-cell system comprising (i) an enclosed vapor-cell region containing a vapor-cell gas phase comprising a vapor-cell alkali or alkaline earth metal and optionally a vapor-cell buffer gas; (ii) an enclosed reservoir region containing a reservoir alkali or alkaline earth metal, wherein the reservoir region is capable of vapor isolation from the vapor-cell region; and (iii) a solid electrolyte disposed in ionic communication between the vapor-cell region and the reservoir region; and applying a voltage across two electrodes situated on opposite sides of the solid electrolyte, to control partial pressure of the vapor-cell alkali or alkaline earth metal at a set-point alkali partial pressure, wherein the set-point alkali or alkaline earth partial pressure is different from the equilibrium vapor pressure of the vapor-cell alkali or alkaline earth metal at the vapor-cell system temperature.

The vapor-cell region is typically configured to allow at least one vapor-cell optical path through the vapor-cell gas phase, and optionally an additional optical path through the reservoir region.

In some embodiments, the set-point alkali or alkaline earth partial pressure is at least ten times higher than the equilibrium vapor pressure of the vapor-cell alkali or alkaline earth metal at the vapor-cell system temperature. In different embodiments, the set-point alkali or alkaline earth partial pressure is at least ten times lower than the equilibrium vapor pressure of the vapor-cell alkali or alkaline earth metal at the vapor-cell system temperature.

The polarity of the voltage may be selected to control direction of alkali or alkaline earth atom flux, either from the reservoir region into the vapor-cell region, or from the vapor-cell region into the reservoir region. The amplitude of the voltage may be selected to control magnitude of alkali or alkaline earth atom flux.

The method may include applying an initial or periodic voltage across separate electrodes situated on opposite sides of an additional solid electrolyte, to initially or periodically load the reservoir region with the reservoir alkali metal. Alternatively or additionally, the method may include applying an initial or periodic voltage across separate electrodes situated on opposite sides of an additional solid electrolyte, to initially or periodically load the vapor-cell region with the vapor-cell alkali or alkaline earth metal.

The vapor-cell alkali or alkaline earth metal and the reservoir alkali or alkaline earth metal may each be selected from the group consisting of Na, K, Cs, Rb, Sr, and combinations thereof.

In some embodiments, the reservoir alkali or alkaline earth metal is present at a higher molar concentration in the reservoir region than the molar concentration of the vapor-cell alkali or alkaline earth metal in the vapor-cell region. Optionally, the set-point temperature and concentration of the vapor-cell alkali or alkaline earth metal are selected to ensure atoms of the vapor-cell alkali or alkaline earth metal are essentially in the vapor phase.

Some methods further include adjusting the vapor-cell system temperature to a set-point temperature. When a buffer gas is present in the vapor-cell region, the partial pressure of the vapor-cell buffer gas may be controlled by the set-point temperature. A vapor-cell buffer gas (if present) may be selected from the group consisting of Ar, Ne, Xe, He, Kr, $N_2$, $NH_3$, $CO_2$, $CH_4$, and combinations thereof.

The solid electrolyte may be selected from the group consisting of alumina, β-alumina, β"-alumina, yttria-stabilized zirconia, NASICON, LISICON, KSICON, and combinations thereof. The solid electrolyte may include a material that is at least partially ion-exchanged with an ionized version of the vapor-cell alkali or alkaline earth metal, initially and/or after a period of time following operation.

In some variations, a vapor-cell subsystem is provided, comprising:

an enclosed vapor-cell region, wherein the vapor-cell region is configured to allow at least one vapor-cell optical path through the vapor-cell gas phase;

an enclosed reservoir region, wherein the reservoir region is capable of vapor isolation from the vapor-cell region; and a solid electrolyte disposed in ionic communication between the vapor-cell region and the reservoir region.

The subsystem may further include a first electrode disposed between the solid electrolyte and the vapor-cell region; and a second electrode disposed between the solid electrolyte and the reservoir region, wherein the second electrode is electrically isolated from the first electrode.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A vapor-cell system comprising:
   an enclosed vapor-cell region containing a vapor-cell gas phase comprising a vapor-cell alkali or alkaline earth metal, wherein said vapor-cell region is configured to allow at least one vapor-cell optical path through said vapor-cell gas phase;
   an enclosed reservoir region containing a reservoir alkali or alkaline earth metal, wherein said reservoir region is capable of vapor isolation from said vapor-cell region;
   a solid electrolyte disposed in ionic communication between said vapor-cell region and said reservoir region;
   a first electrode disposed between said solid electrolyte and said vapor-cell region; and
   a second electrode disposed between said solid electrolyte and said reservoir region, wherein said second electrode is electrically isolated from said first electrode.

2. The vapor-cell system of claim 1, wherein said vapor-cell alkali or alkaline earth metal is selected from the group consisting of Na, K, Cs, Rb, Sr, and combinations thereof.

3. The vapor-cell system of claim 1, wherein said vapor-cell alkali or alkaline earth metal is isotopically enriched.

4. The vapor-cell system of claim 1, wherein said vapor-cell alkali or alkaline earth metal is isotopically pure.

5. The vapor-cell system of claim 1, wherein said vapor-cell gas phase further includes a vapor-cell buffer gas.

6. The vapor-cell system of claim 5, wherein said vapor-cell buffer gas is selected from the group consisting of Ar, Ne, Xe, He, Kr, $N_2$, $NH_3$, $CO_2$, $CH_4$, and combinations thereof.

7. The vapor-cell system of claim 1, wherein said vapor-cell region is fabricated with a vapor-cell-region enclosure material selected from the group consisting of silicon, $SiO_2$, fused silica, quartz, pyrex, a metal, a dielectric, and combinations thereof.

8. The vapor-cell system of claim 1, wherein said reservoir alkali or alkaline earth metal is selected from the group consisting of Na, K, Cs, Rb, Sr, and combinations thereof.

9. The vapor-cell system of claim 1, wherein said reservoir region is fabricated with a reservoir-region enclosure material selected from the group consisting of silicon, $SiO_2$, fused silica, quartz, pyrex, a metal, a dielectric, and combinations thereof.

10. The vapor-cell system of claim 1, wherein said reservoir region is configured to allow a reservoir-region optical path through said reservoir region.

11. The vapor-cell system of claim 1, wherein said solid electrolyte comprises alumina, β-alumina, β"-alumina, yttria-stabilized zirconia, NASICON, LISICON, KSICON, and combinations thereof.

12. The vapor-cell system of claim 11, wherein said solid electrolyte contains at least 90 wt % β"-alumina.

13. The vapor-cell system of claim 1, wherein said solid electrolyte is at least partially ion-exchanged with an ionized version of said vapor-cell alkali or alkaline earth metal.

14. The vapor-cell system of claim 1, said system further comprising an additional solid electrolyte disposed in ionic communication between said vapor-cell region and an external source of alkali or alkaline earth metal, for initial or periodic loading of said vapor-cell region with said vapor-cell alkali or alkaline earth metal.

15. The vapor-cell system of claim 1, said system further comprising an additional solid electrolyte disposed in ionic communication between said reservoir region and an external source of alkali or alkaline earth metal, for initial or periodic loading of said reservoir region with said reservoir alkali or alkaline earth metal.

16. The vapor-cell system of claim 1, wherein said system is contained within an oven configured with temperature control.

17. The vapor-cell system of claim 1, said system further including a temperature-measurement device.

18. The vapor-cell system of claim 17, wherein said temperature-measurement device is a thin-film resistance temperature detector.

19. The vapor-cell system of claim 1, said system further comprising a heater to controllably increase ionic conductivity of said solid electrolyte.

20. The vapor-cell system of claim 1, said system further comprising a membrane which is capable of membrane deflection as the pressure of said vapor-cell gas phase changes, wherein said membrane deflection is electrically or piezoelectrically detected.

21. The vapor-cell system of claim 1, said system further comprising a membrane which is capable of membrane deflection as the pressure changes between said vapor-cell region and a reference-cell region having a known pressure.

22. The vapor-cell system of claim 1, wherein said reservoir region is configured to allow a reservoir-region optical path through said reservoir region, and wherein said system is configured to provide a first laser beam directed to said at least one vapor-cell optical path and a second laser beam directed to said reservoir-region optical path.

23. The vapor-cell system of claim 22, said system comprising a first laser source providing said first laser beam, and a second laser source providing said second laser beam.

24. The vapor-cell system of claim 22, said system comprising a single laser source that is split to said first laser beam and said second laser beam.

25. The vapor-cell system of claim 22, said system further comprising a sensor to detect an absorption difference between said first laser beam and said second laser beam, wherein said absorption difference is correlated to a difference in alkali or alkaline earth vapor pressure between said vapor-cell region and said reservoir region.

26. A method of operating a vapor-cell system, said method comprising:

providing a vapor-cell system including (i) an enclosed vapor-cell region containing a vapor-cell gas phase comprising a vapor-cell alkali or alkaline earth metal and optionally a vapor-cell buffer gas; (ii) an enclosed reservoir region containing a reservoir alkali or alkaline earth metal, wherein said reservoir region is capable of vapor isolation from said vapor-cell region; and (iii) a solid electrolyte disposed in ionic communication between said vapor-cell region and said reservoir region; and applying a voltage across two electrodes situated on opposite sides of said solid electrolyte, to control partial pressure of said vapor-cell alkali or alkaline earth metal at a set-point alkali partial pressure, wherein said set-point alkali or alkaline earth partial pressure is different from the equilibrium vapor pressure of said vapor-cell alkali or alkaline earth metal at the vapor-cell system temperature.

* * * * *